(12) United States Patent
Runge

(10) Patent No.: US 9,869,700 B2
(45) Date of Patent: Jan. 16, 2018

(54) DEVICE FOR USE WITH AN ELECTRICITY METER

(71) Applicant: ITRON ZAEHLER & SYSTEMTECHNIK GMBH, Hameln (DE)

(72) Inventor: Christoph Runge, Hameln (DE)

(73) Assignee: Itron, Inc., Liberty Lake, WA (US)

( * ) Notice: Subject to any disclaimer, the term of this patent is extended or adjusted under 35 U.S.C. 154(b) by 1 day.

(21) Appl. No.: 14/891,341

(22) PCT Filed: May 7, 2014

(86) PCT No.: PCT/EP2014/059384
§ 371 (c)(1),
(2) Date: Nov. 14, 2015

(87) PCT Pub. No.: WO2014/184076
PCT Pub. Date: Nov. 20, 2014

(65) Prior Publication Data
US 2016/0084885 A1  Mar. 24, 2016

(30) Foreign Application Priority Data
May 15, 2013 (EP) .................................... 13167871

(51) Int. Cl.
*G01R 21/00* (2006.01)
*G01R 15/14* (2006.01)
(Continued)

(52) U.S. Cl.
CPC .............. *G01R 15/14* (2013.01); *G01R 11/04* (2013.01); *G01R 21/00* (2013.01); *G01R 22/065* (2013.01); *H01H 9/102* (2013.01); *H01H 85/205* (2013.01)

(58) Field of Classification Search
CPC combination set(s) only.
See application file for complete search history.

(56) References Cited

U.S. PATENT DOCUMENTS

| 1,970,520 A | 8/1934 | Hanny |
| 5,620,337 A | 4/1997 | Pruehs |

(Continued)

FOREIGN PATENT DOCUMENTS

| EP | 2209012 A2 | 7/2010 |
| EP | 2482082 A1 | 8/2012 |
| GB | 2187851 A | 9/1987 |

OTHER PUBLICATIONS

EP extended Search Report, EP13167871, dated Oct. 22, 2013, 9 pages.
(Continued)

*Primary Examiner* — Minh Phan
(74) *Attorney, Agent, or Firm* — Lee & Hayes, PLLC

(57) ABSTRACT

A device for use with an electricity meter is selectively moveable between first and second positions. The device comprises a fuse support capable of holding a fuse in a fuse position. The device is arranged such that, when in the first position, the fuse position is located relative to first and second circuits such that when a fuse is held in the fuse support the first circuit is closed and the second circuit is open. The device is further arranged such that moving the device from the first position to the second position causes the fuse position to be relocated relative to the first and second circuits such that the first circuit is opened and the second circuit is closed.

20 Claims, 5 Drawing Sheets

(51) Int. Cl.
*G01R 11/04* (2006.01)
*G01R 22/06* (2006.01)
*H01H 9/10* (2006.01)
*H01H 85/20* (2006.01)

(56) References Cited

U.S. PATENT DOCUMENTS

| | | |
|---|---|---|
| 6,663,422 B1 | 12/2003 | Robinson et al. |
| 6,847,200 B1 | 1/2005 | Stabler |
| 2007/0117436 A1 | 5/2007 | Davis |
| 2012/0276775 A1 | 11/2012 | Garwood et al. |

OTHER PUBLICATIONS

PCT Search Report dated Jun. 5, 2014 for PCT application No. PCT/EP2014/059384, 11 pages.

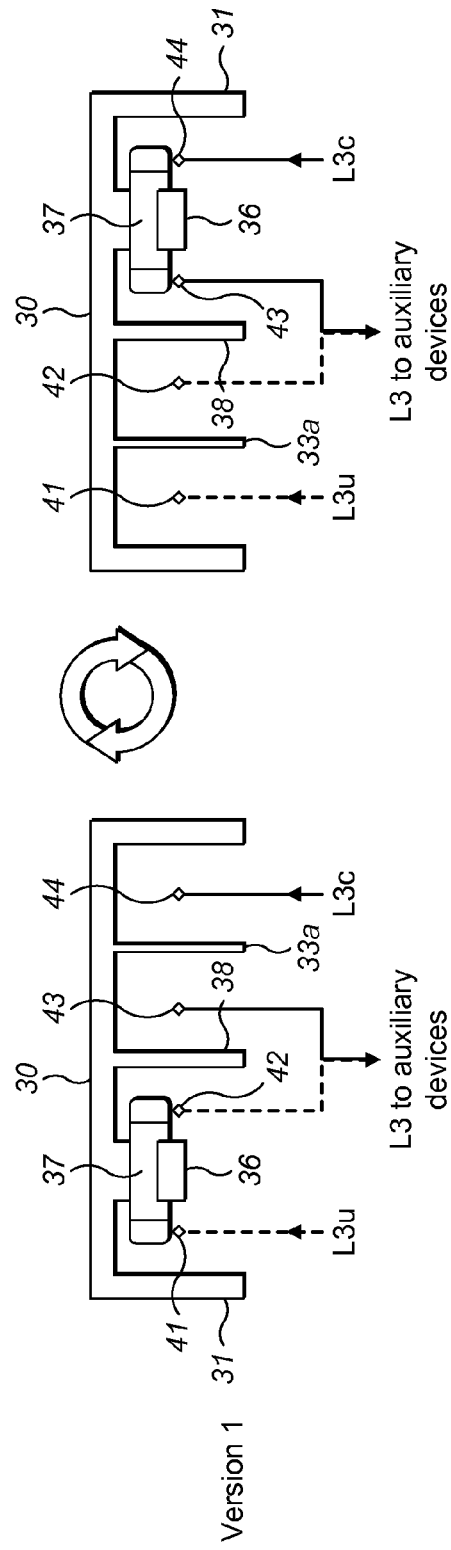
FIG. 4a
FIG. 4b
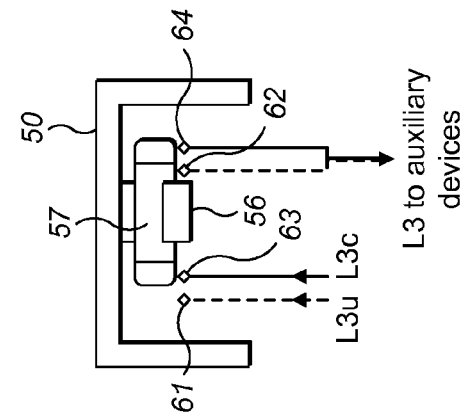
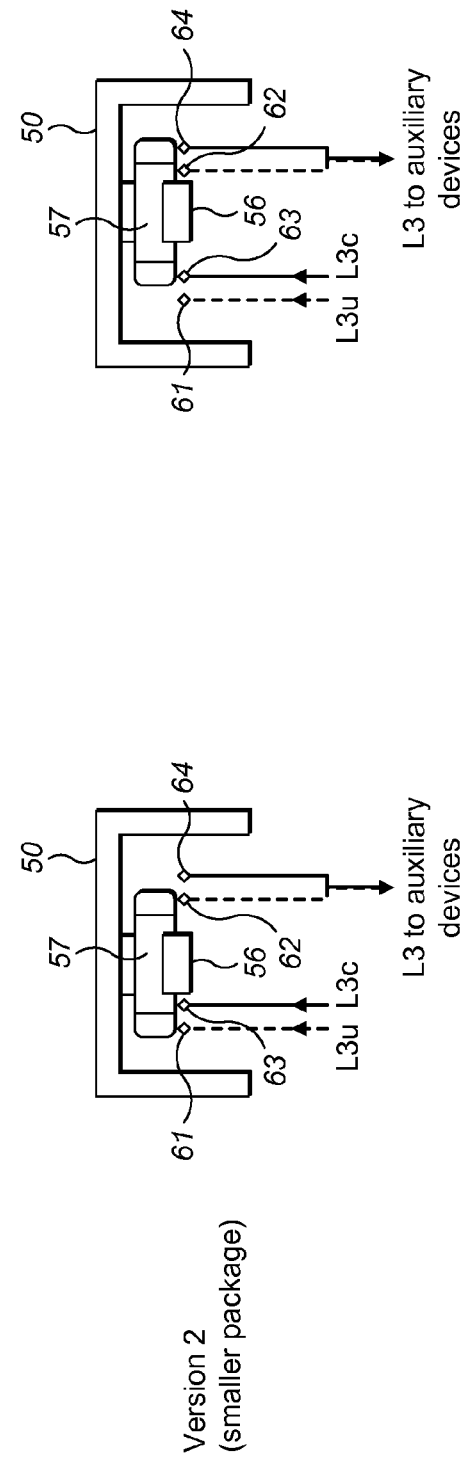
FIG. 4c
FIG. 4d

DEVICE FOR USE WITH AN ELECTRICITY METER

This Application is a National Stage of PCT International Application No. PCT/EP2014/059384, filed May 7, 2014, which claims priority to European Application No. 13167871.6, filed May 15, 2013, both of which are incorporated herein by reference in their entirety.

FIELD OF THE DISCLOSURE

The present disclosure relates to a device for use with an electricity meter, for opening and closing circuits in the electricity meter. The disclosure also relates to a method of using such a device, as well as to a system incorporating the device together with a main electrical device and an auxiliary electrical device.

BACKGROUND

In the context of smart metering, auxiliary devices used with electricity meters are often placed next to the electricity meter. For example, in Germany it is a requirement that electricity meters be capable of being connected to auxiliary device modules, and that such connections be provided with fuses for safety. These additional modules, such as gateways, modems, tariff modules or customer information modules must be supplied with mains voltage.

In principle, the electrical connection to these auxiliary devices may be mounted in one of two different ways. Either the electrical connection to the mains is before the electricity meter, or else it is after the meter. In the first case, also known as the unmeasured connection, the meter will not register the consumption of the connected auxiliary device and the consumption will be at the electricity supplier's expense. In the second case, the auxiliary device is connected after the meter, which implies that the consumption it be registered by the electricity meter and therefore at the customer's expense.

The choice of connection depends, among other things, on the power consumption of the connected auxiliary device. The choice of connection type is generally given to the technician installing the auxiliary device. However, during the lifetime of the meter it may be desirable to change the connection type between these two states, such that the meter may register the energy consumption of the auxiliary device, or else such that the meter does not register the energy consumption of the auxiliary device. For example, when there is a change in energy supplier, the customer's contract may stipulate that auxiliary devices connected to the meter must be operated at the customer's expense, in which case the connection type may need changing.

According to general installation rules, the connection to the auxiliary device or devices must be protected by an electrical fuse against over-current. Fuses, which are generally installed before the electricity meter, must fulfill the requirements to a defined maximum High Breaking Capacity (HBC). If the connection needs to be switched, then typically a jumper located before the meter must be operated to break the connection, after which the fuse may be manually relocated to change the commotion type. However, jumpers generally have high restrictions (for example, they must have double isolation) and add expense to the meter setup.

There is therefore a need in the art to provide an improved device end method that aim to address these and other deficiencies encountered in the prior art. The present disclosure proposes a novel device and method for safely and efficiently changing the connection type.

SUMMARY

The present invention relates to a device and to the use of electrical fuses with the device for connecting auxiliary devices to electricity meters. The combination of a device and fuse may protect a connected auxiliary device and may provide the option of selecting the type of electrical connection between two terminals. Thus, the device may ensure that only one terminal is electrically connected at any given time. In addition, the selection can be made at mains voltage.

In accordance with a first aspect of the invention, there is provided a device for use with an electricity meter. The device is selectively movable between first and second positions. The device comprises a fuse support capable of holding a fuse in a fuse position. The device is arranged such that, when in the first position, the fuse position is located relative to first and second circuits such that when a fuse is held in the fuse support the first circuit is closed and the second circuit is open. The device is further arranged such that moving the device from the first to the second position causes the fuse position to be relocated relative to the first and second circuits such that the first circuit is opened and the second circuit is closed.

The fuse support may be advantageously arranged to hold and retain a fuse in a fuse position. Thus, when the device is moved between the first and second positions, a fuse held in the fuse support may effectively be retained with the device and moved simultaneously with the device. A fuse held in the fuse support may be arranged to open and close a circuit in the meter, or a circuit connecting the meter to the auxiliary device. Where reference is made to the first/second circuit opening/closing, it should be understood as meaning that the fuse is positioned so as to join two contact points of the circuit in electrical conductance, or else break the electrical connection between the two contact points in the case of the fuse being removed from the circuit. Thus, whilst a circuit portion may be 'closed' by the fuse, this does not preclude other portions of the circuit being temporarily open. The fuse position may be defined as the position taken by a film when held in the fuse support. For example, the fuse position may be measured from the centre of the fuse when held in the fuse support, or may be defined relative to the ends of the fuse when held in the fuse support.

The fuse support may take various different forms. For example, a fuse may be snap-fitted into the fuse support. In other embodiments, a more permanent fixture may exist between the fuse and the fuse support. Preferably, the device comprises as fuse cover or similar cover portion for covering the fuse when the device is installed in a meter. Thus, the device may further comprise a fuse cover for covering a fuse held in the fuse support when the device is used with an electricity meter.

Preferably, the device complies with EC standard 60536: "*Classification of the electrical and electronic devices for protection against electrical shock*". In this context, category PC2 is applicable. Generally, the device should be designed in a way that it may prevent contact of fingers with live parts (which is an inspection condition according to DIN EN 60529). Whilst the device may take various shapes end forms, its typical dimensions may be in the range of about 5 mm×20 mm to about 6.3 mm×32 mm. Given such a shape, the device can be located deep enough within the meter housing to meet the requirements of category PC2.

The device is generally intended to be placed in the electricity meter below a sealable terminal cover to prevent tempering.

A distance between the fuse position and a top portion of the device may be at least about 8 mm (e.g. to provide a minimum safety distance between the fuse and a user's fingers handling the device). This distance may be measured from a centre of a fuse held in the fuse support vertically upwards to a fuse cover at the top of the device.

Thus, the inventive device provides a relatively safe and efficient means of selecting and alternating between two different connection types between an electricity meter and an auxiliary device. The device effectively incorporates the dual function of a jumper and a fuse. In other words, a circuit may effectively be broken and a fuse removed from it in a single step. There is no need to first operate a jumper prior to removal of the use. Furthermore, a user is less likely to misplace or accidentally drop the fuse during relocation, as it may be safely retained in the device by means of the fuse support holding it in place.

The device may further comprise first and second supports at either end of a length of the device. The fuse position may be located between the first and second supports. In one embodiment, the device comprises a pair of legs defining ends of the device, the legs being joined by a crossbar or similar fuse cover. The fuse cover may offer a measure of protection to the fuse such that when the device is installed in an electricity meter the fuse is hidden from view and reduces the fuse's exposure. The device may therefore prevent someone from accidentally coming into contact with the fuse. By positioning the fuse support between the first and second ends, it may be made easier to hide the fuse from view by means of the fuse cover or crossbar. Thus, for example, the fuse support may be arranged such that it extends away from the fuse cover and holds a fuse in a fuse position between the first and second ends or legs of the device, hidden by the fuse cover. The legs or supports of the device may furthermore assist in providing a minimum of distance or clearance between the user and the fuse.

The fuse position may be located between the first support and a midsection, centre or midpoint of the device. This arrangement may be advantageous as the resulting device has a smaller footprint within the meter. For example, a simple rotation of the device through 180° may be sufficient to bring the fuse support from one position to another, without requiring a complete repositioning of the device within the meter. It may be furthermore advantageous with this design to provide non-conducting member located between the midsection and the second end or supporting leg of the device. The non-conducting member may extend away from the fuse cover. This may ensure that when in either the first or second position only a single circuit is closed as the crossbar effectively prevents the device from being installed in the meter if a fuse is already in use with the circuits.

The fuse position may be offset from a midsection of the device by a distance less than half a length of a fuse to be held in the fuse support. By incorporating a slight offset between the fuse position and the midsection of the device in this manner, the device may be rotated through 180° in order to move it between the first and second positions. In this case, in the first position the device is effectively a mirror image of itself in the second position. Whilst it may be more difficult in this embodiment to prevent the fuse accidentally interacting with another circuit, the device does not have to be as long as in the example where the fuse position is located between one leg and the midsection. To provide even great space-saving benefits, the fuse support may be located substantial equidistant from the legs or ends of the device. In such a case, it may be possible to simply translate the device between two different positions to selectively open/close the first and second circuits. It may also be possible to move the device between two relatively distant positions in the electricity meter—in other words to open and close the circuits the device may simply be entirely relocated, for example if the circuits are physically distant one from the other.

The device may further comprise an informational component inscribed on or attached to the device for indicating a relative orientation of the device. For example, the informational component may be disposed on a fuse cover of the device that is visible to a user when the device is installed. Thus, for example, a user may rapidly determine whether the auxiliary device is connected before or after the meter, and therefore whether or not the meter is registering the auxiliary device's energy consumption.

The device may be elongate such that the device may define a longitudinal axis. The fuse support may be arranged to hold a fuse in the fuse position such that a held fuse is aligned with the longitudinal axis. By holding the fuse in-line with the longitudinal axis of the device, the device may be more profiled and therefore may be more easily installed. This may furthermore reduce the space requirements of the device, where generally free space within an electricity meter or the like is scarce.

The device may further comprise an outwardly extending member for facilitating removal of the device from an electricity meter when the device is in use with an electricity meter. For example, the outwardly extending member or flange may extend away from a fuse cover of the device. A screwdriver or other leveraging tool may then be used to prise or otherwise remove the device from an electricity meter. When installed in the meter, a fuse cover of the device may be arranged to lie flush with the housing at the meter, and the outwardly extending member or side bar may facilitate removal of the device in such cases.

The first circuit may connect an electricity meter with an auxiliary device, and when the first circuit is closed the auxiliary device may be connected before the electricity meter such that the electricity meter does not register an electricity consumption of the auxiliary device. Similarly, the second circuit may connect an electricity meter with an auxiliary device, and when the second circuit is closed the auxiliary device may be connected after the electricity meter such that the electricity meter registers an electricity consumption of the auxiliary device.

In a second aspect of the invention, there is provided a method of selectively opening and closing first and second circuits connecting an electricity meter and an auxiliary device. The method comprises providing a device with a fuse support capable of holding a fuse in a fuse position. The method also comprises engaging a fuse with the fuse support such that the fuse is held in the fuse position. The method also comprises selectively moving the device between first and second positions such that the fuse alternately opens and closes the first and second circuits.

Thus, a user may safely move the device between first and second positions to selectively open and close first and second circuits in the meter without having to resort to the use of as jumper or the like. Furthermore, the fuse may be safely retained by the fuse holder so as to reduce the risk of loss and or damage to the fuse during repositioning.

The step of selectively moving the device may comprise rotating the device 180° about an axis passing through its center. In one embodiment, the axis passes perpendicularly to a fuse cover or crossbar of the device and parallel to a pair of legs of the device, the legs extending away from the crossbar. The axis may also be perpendicular to a longitudinal axis defined by a fuse held in the fuse support.

In the first position the fuse may connect two circuit points of the first circuit. In the second position the fuse may conned two circuit points of the second circuit. In each of the first and second positions each pair of circuit points may be located between a respective end of the device and a midsection of the device.

When the fuse is arranged to contact two circuit points located between a first end or leg of the device and a midsection of the device, there may be less risk of the fuse accidentally contacting the wrong contact points. Thus, for example, the two contact points of one of the first and second circuits may be adjacent each other. Preferably, the distance separating the two pairs of contact points may be similar the length of the device, such that it may be necessary to move the device only a small amount when altering the connections between the electricity meter and the auxiliary device. For example, the device may simply be rotated 180° to relocate the fuse position The first position the fuse may connect two circuit points of the first circuit. In the second position the fuse may connect two circuit points of the second circuit. In each of the first and second positions a first one of each pair of circuit points may be located between a first end of the device and a midsection of the device. The second one of each pair of circuit points may be located between a second end of the device and the midsection of the device. This arrangement may be preferable as it provides a device of reduced length. For example, the fuse position may be located only slightly offset from the centre of the device, such that rotating the device 180° may result in a relatively small translation of the fuse position, preferably of a distance less than half a length of the fuse. In this embodiment, it may be preferable for a circuit point of each of the first and second circuits to be disposed on either side of the midsection of the device. Thus, each circuit point of one of two circuits may be disposed adjacent a circuit point of the other circuit.

In a third aspect of the invention there is provided a system for selectively opening and closing first and second circuits. The system comprises a main electrical device connected to an auxiliary electrical device via the first and second circuits. The system further comprises a device according to any of the above-described embodiments. In the first position the first circuit is closed and the second circuit is open. In the second position the first circuit is open and the second circuit is closed.

The main electrical device may be an electricity meter.

When the first circuit is closed the auxiliary electrical device may be connected before the electricity meter such that the electricity meter does not register an electricity consumption of the auxiliary electrical device.

When the second circuit is closed the auxiliary electrical device may be connected after the electricity meter such that the electricity meter registers an electricity consumption of the auxiliary electrical device.

BRIEF DESCRIPTION OF THE DRAWINGS

Preferred embodiments of the invention will now be described in connection with the accompanying drawings, of which:

FIGS. 4a and 4b are diagrammatic representations of a connection selector in accordance with a first embodiment of the invention;

FIGS. 4c and 4d are diagrammatic representations of a connection selector in accordance with a second embodiment of the invention;

DETAILED DESCRIPTION OF PREFERRED EMBODIMENTS

The present invention seeks to provide an improved device for selectively changing connections between an electricity meter and an auxiliary device. Whilst various embodiments of the invention are described below, the invention is not limited to these embodiments, and variations of these embodiments may well fall within the scope of the invention which is to be limited only by the appended claims.

Figure 1:
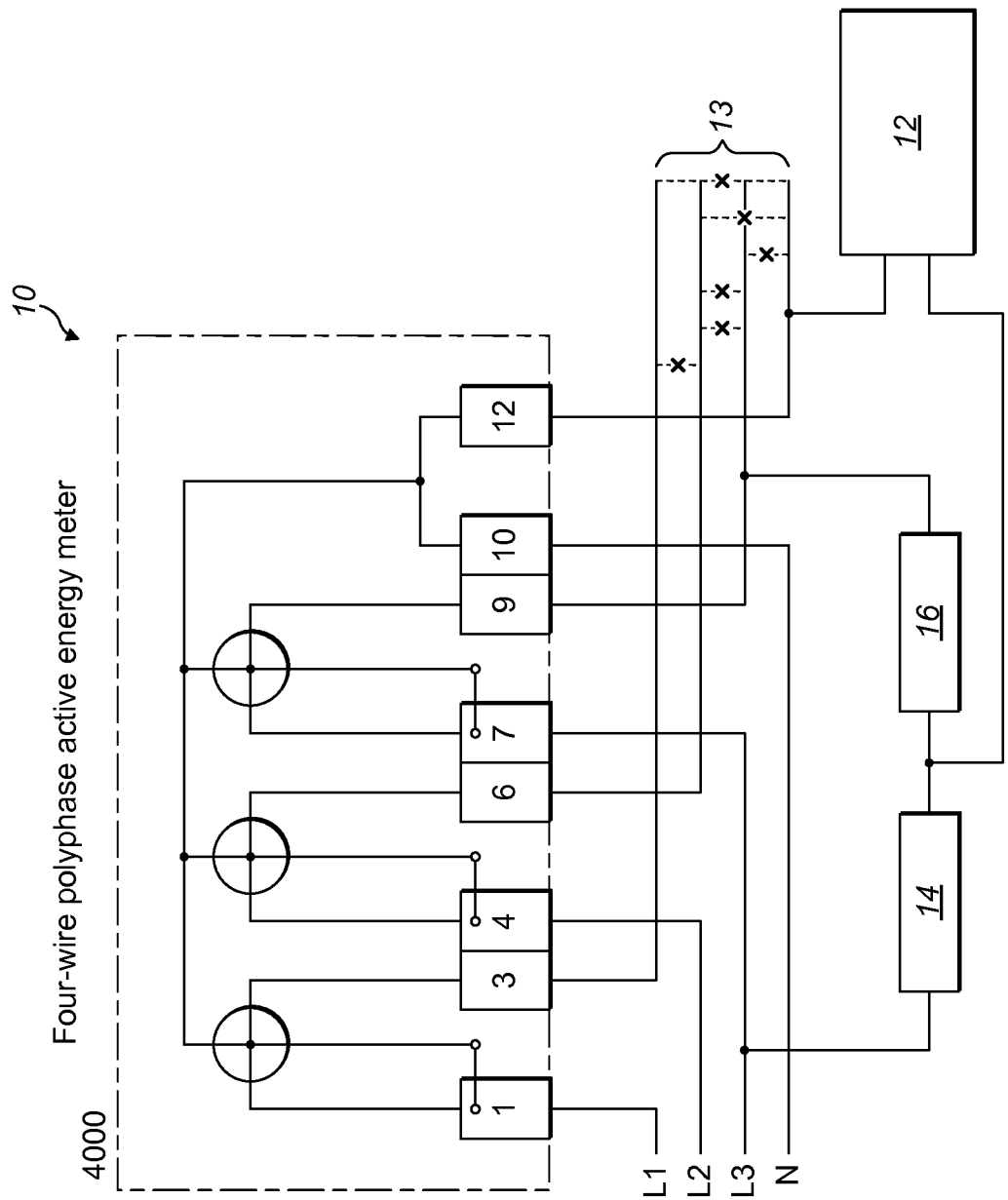
FIG. 1 is a circuit diagram of an auxiliary device connected to an electricity meter.

FIG. 1 shows a circuit or connection diagram of a common electricity meter 10 with an auxiliary device 12. Lines L1, L2, L3 and N are electrical lines positioned before the meter, with corresponding lines 13 after the meter. Two fuse holders, 14 and 16, are connected to meter 10 and auxiliary device 12. Fuse holder 14 is connected before meter 10, and fuse holder 16 is connected after meter 10. Thus, if fuse holder 14 is assembled (i.e. if a fuse is inserted or otherwise engaged with fuse holder 14), then auxiliary device 12 will be connected before meter 10. If auxiliary device 12 is connected before meter 10, the meter 10 will not register the electricity consumption of auxiliary device 12. Alternatively, if fuse holder 16 is assembled, then auxiliary device 12 will be connected after meter 10. In this case, meter 10 will register the electricity consumption of auxiliary device 12. It should be borne in mind that both fuses holders 14 and 16 must not be assembled at the same time, i.e. only one fuse should ever be engaged with the fuse holders, either in fuse holder 14 or in fuse holder 16. Otherwise, the current path of the meter will be by-passed, and the meter will not measure any current along line L3. Of course, in other embodiments fuse holders 14 and 16 may be connected to any of the other lines shown in FIG. 1. Line L3 is merely used as an example.

Thus, fuse holders 14 and 16 are effectively part of two different circuits. A first circuit may be held to comprise meter 10, auxiliary device 12 and fuse holder 14, with auxiliary device 12 being electrically positioned before meter 10. A second circuit may be held to comprise meter 10, auxiliary device 12 and fuse holder 16, with auxiliary device 12 being electrically positioned after meter 10.

Figure 2:
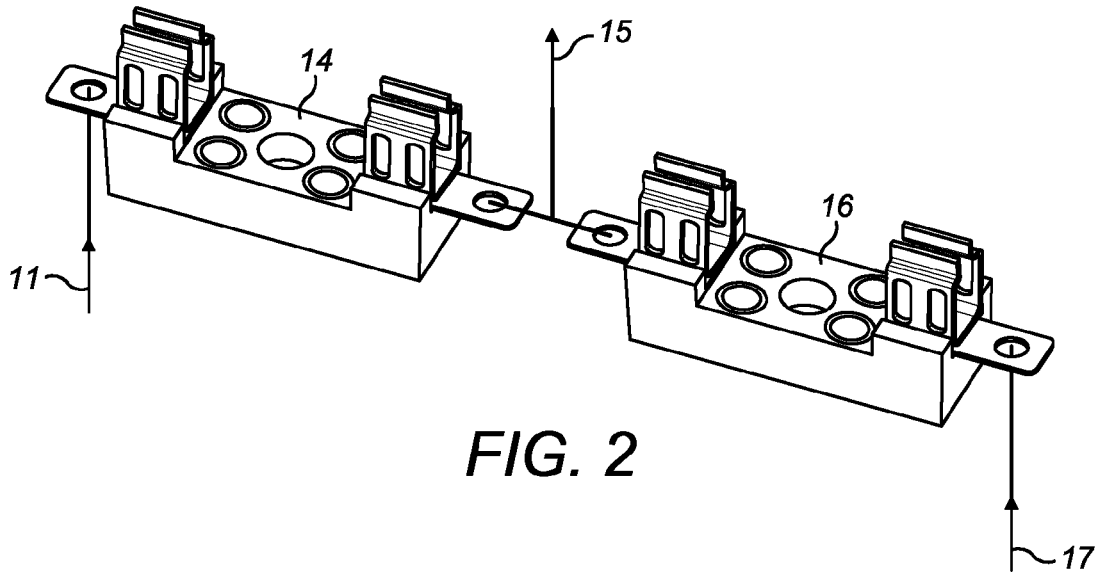
FIG. 2 is a perspective view of two fuse holders.

FIG. 2 shows fuse holders 14 and 16 in greater detail. In the current embodiment, electrical fuse holders 14 and 16 are of the Rivet/Eyelet Mount Solder type, and should be placed in the electricity meter. Besides these conventional fuse holders or clips, a type directly soldered onto the PCB is also possible. In other embodiments, fuse holders 14 and 16 may simply be replaced with gaps in the circuit into which fuses may be inserted or otherwise engaged to complete the circuits. Line 11 is a connection to the electricity meter (before the meter). Line 15 is a connection to the auxiliary device. And line 17 is a connection to the electricity meter (after the meter). Fuse holders 14 and 16 are used with a connection selector such as the one described below in connection with FIG. 3.

Figure 3:
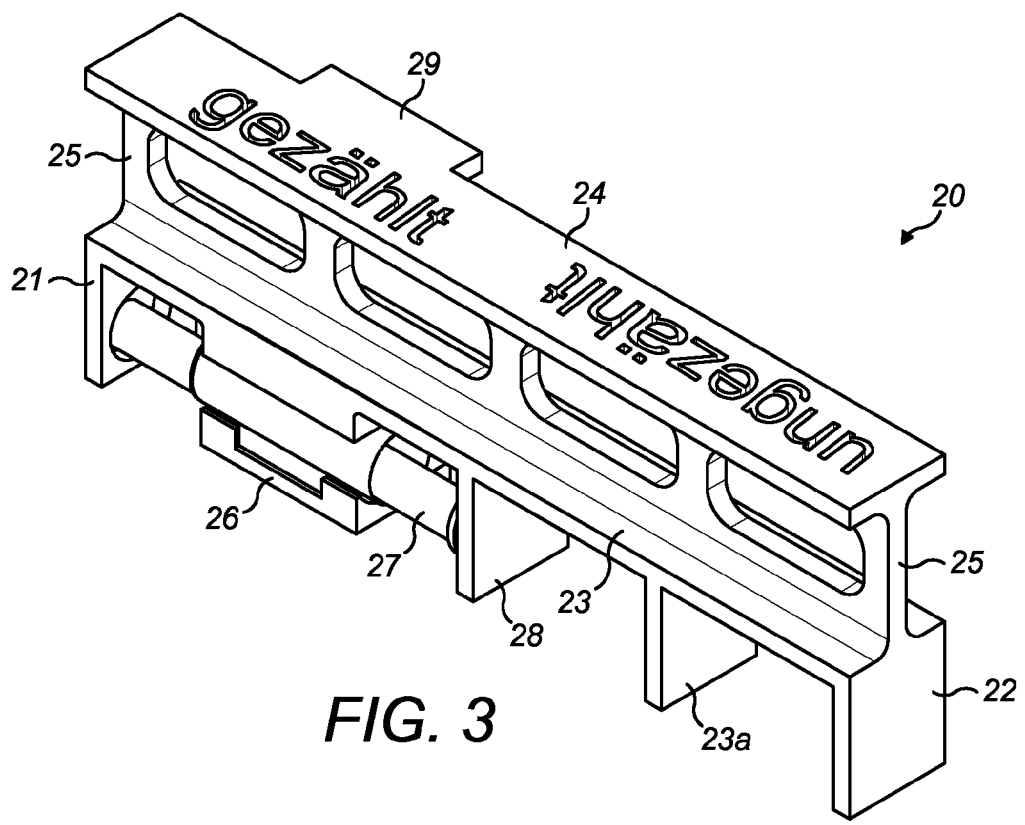
FIG. 3 is a perspective view of a connection selector holding a fuse, in accordance with an embodiment of the invention.

In accordance with a first embodiment of the invention, there is shown in FIG. 3 a device 20 (hereinafter referred to as a connection selector) that may be used to selectively open and close the first and second circuits referred to above. Connection selector 20 is preferably made of plastic, although other insulating materials may be used without departing from the scope of the invention. Connection selector 20 comprises a pair of opposed legs or uprights 21, 22, extending from a crossbar 23 joining legs 21 and 22. Extending away from crossbar 23 is a fuse cover 24 held at a distance from crossbar 23 by a plurality of supporting members or struts 25. Of course, in more general terms fuse cover may be supported at a distance from crossbar 23 using other means. In other embodiments, fuse cover 24 may be removed thereby leaving only crossbar 23. The distance separating fuse cover 24 from crossbar 23 is preferably in accordance with touch-protection category PC2.

Connection selector 20 comprises a fuse support 26 that is arranged to hold fuse 27 in a fuse position. FIG. 3 shows connection selector 20 with fuse 27 already held in the fuse position by fine support 26. In the present embodiment, fuse support 26 takes the form of a pair of jaws into which fuse 27 may be inserted or clipped such that it may be held and retained in frictional engagement with fuse support 26.

Legs 21 and 22 define first and second ends of connector selector 20. Fuse support 26 located between first leg or end 21 and a centre point, midpoint or midsection 28 of connection selector 20 such that the fuse position is positioned between first end 21 and midsection 28.

Fuse cover 24 includes a side bar or other projecting flange 29 arranged to facilitate removal of connection selector 20 from an electricity meter. For example, a user may insert a screwdriver or other lever beneath sidebar 29 so as to prise connection selector 20 out of the electricity meter. After removing connection selector 20 from the electricity meter, fuse 27 is disconnected from the circuit it was engaged with whilst remaining held in fuse support 26, and is effectively transported with connection selector 20. Thus, a defective fuse in connection selector 20 may be easily identified and replaced.

Connection selector 20 further comprises a tamper-proof crossbar 23a extending away from crossbar 23 and between legs 21 and 22. Tamper-proof crossbar 23a may ensure that connection selector 20 may not be engaged with fuse holders (such as fuse holders 14 and 16 described above) if a fuse is already inserted in one of the fuse holders. This avoids the above-mentioned by-passing of the current path and thereby provides a safety mechanism.

Fuse cover 24 comprises text inscribed into it to indicate a relative orientation of connection selector 20. In FIG. 3, the German words for "counted" and "uncounted" are inscribed, thereby indicating, when connection selector 20 is installed in a meter, whether or not the energy consumption of an auxiliary device is being registered by the electricity meter (e.g. whether the first or second closed).

In the present embodiment, the counterparts to connection selector 20 are fuse holders 14 and 16 in an electricity meter, which are shown in FIG. 2. Thus, preferably, both electrical fuse holders 14 and 16 are aligned and the distance separating them corresponds approximately to a length of connection selector 20.

In use, when an auxiliary device is connected to en electricity meter, a connection selector such as connection selector 20 may be used to connect the auxiliary device to the electicity meter via either the first or second circuit (as in FIG. 1). For example, if auxiliary device 12 is to be connected before meter 10, connection selector 20 may be engaged with fuse holder 12 such that fuse 27 held in fuse support 26 engages with fuse holder 12 and completes the first circuit.

To select a different type of connection, connection selector 20 may be turned 180° about an axis passing through its midsection (e.g. normal to a longitudinal axis defined by connection selector 20). Thus, continuing from the example above, through rotation of connection selector 20 relative to fuse holders 14 and 16, fuse 27 may be relocated from fuse holder 14 to fuse holder 16, thereby opening the first circuit and closing the second circuit. Thus, when disengaging connection selector 20 from one of fuse holders 14 and 16, fuse 27 is held and retained by fuse support 26 in connection selector 20. After turning connection selector 20 180°, connection selector 20 may then be reconnected with the other of fuse holders 14 and 16.

The labeling or marking on fuse cover 24 indicates the type of connection currently in effect. Such labeling can be for example pictograms or inscriptions like "counted" uncounted, as in FIG. 3.

FIGS. 4a and 4b show an embodiment of a correction selector 30 moved between two different positions relative to an electrical meter. In Version 1 (similar to connection selector 20 shown in FIG. 3), fuse 37 first contacts in FIG. 4a two different contact points 41 and 42 of a first circuit. Contact points 41 and 42 are adjacent each other and are located between the first end 31 of connection selector 30 and the centre or midsection 38 of connection selector 30. Contact points 41 and 42 belong to line L3u and it connected may complete the first circuit such that an auxiliary device is connected before the meter. Tamper-proof crossbar 33a is positioned between adjacent contact points 43 and 44 of a second circuit, and prevents connection selector 30 from being positioned as it is in FIG. 4a if a fuse were already engaged with contact points 43 and 44. In moving connection selector 30 to the second position, connection selector 30 is rotated by 180° such that the fuse position is moved to the position shown in FIG. 4b.

In FIG. 4b, fuse 37 which is retained in fuse support 36 during the rotation of connection selector 30 now contacts adjacent contact points 43 and 44 of line L3c, belonging to a second circuit. Relocation of connection selector 30 in this manner opens the first circuit and closes the second circuit such that the auxiliary device is connected after the meter. Tamper-proof crossbar 33a is now positioned between contact points 41 and 42 of the first circuit, and prevents connection selector 30 from being positioned as it is in FIG. 4b if a fuse were already engaged with contact points 41 and 42.

In FIGS. 4c and 4d, there is shown a second version or embodiment of a connector selector 50. Connection selector 50 does not comprise a tamper-proof crossbar. Instead, fuse support 56 is slightly offset from the centre or midsection of connection selector 50 such that the ruse position is also offset. In FIG. 4c, fuse 57 connects contact points 61 and 62 that are this time on opposite sides of fuse support 56. As in FIGS. 4a and 4b, contact points 61 and 62 are part of line L3u belonging to the first circuit. When contact points 61 and 62 are connected, the first circuit is completed such that an auxiliary device is connected before the meter.

In FIG. 4d, fuse 57 which is retained in fuse support 56 during the rotation of connection selector 50 now contacts two contact points 63 and 54 of line L3c, belonging to a second circuit. Contact points 63 and 64 are on opposite sides of fuse support 56. Relocation of connection selector 50 in this manner opens the first circuit and closes the second circuit such that the auxiliary device is connected after meter.

Figure 5:
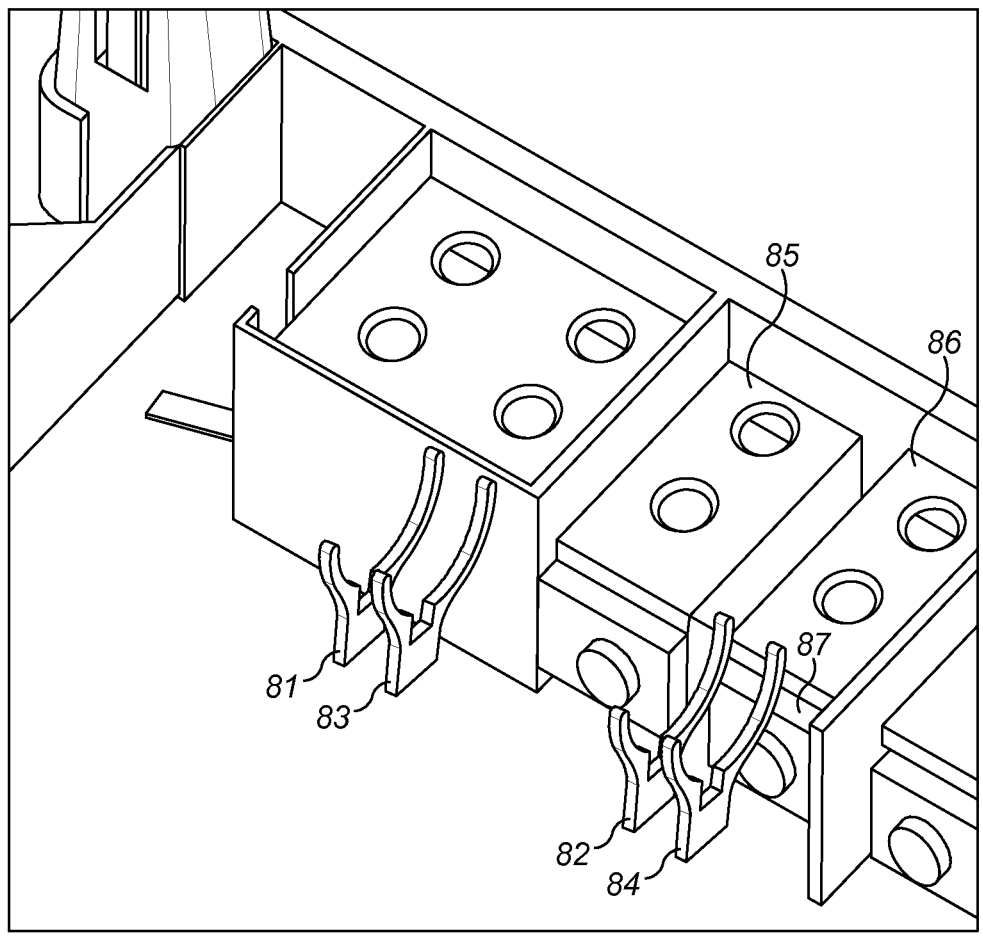
FIG. 5 is a view of a part of an electricity meter before a connection selector is installed.

FIG. 5 shows a terminal area of an electricity meter with fuse clips. The arrangement of the fuse clips is similar to the arrangement of contact points 61-64 shown in FIGS. 4c and 4d and discussed above. Fuse clips 81 and 83 are connected together and lead to a power socket for the auxiliary device. Fuse clip 82 is connected to terminal 85 (L3c), whilst fuse clip 84 is connected to terminal 86 (L3u). Terminals of lines L3c and L3u, 85 and 86, are shown behind fuse clips 82 and 84, respectively. A meter shunt 87 is shown between terminals 85 and 86, and therefore also between fuse clips 82 and 84. The two clips on the right, 82 and 84, are supplied through the PCB from terminal 86 (L3u) and terminal (85) L3u (u=line uncounted, c=line counted) separately whereas the two clips on the left, 81 and 83, are jointed together and are supplied by one side of the power socket for auxiliary devices.

Figure 6:
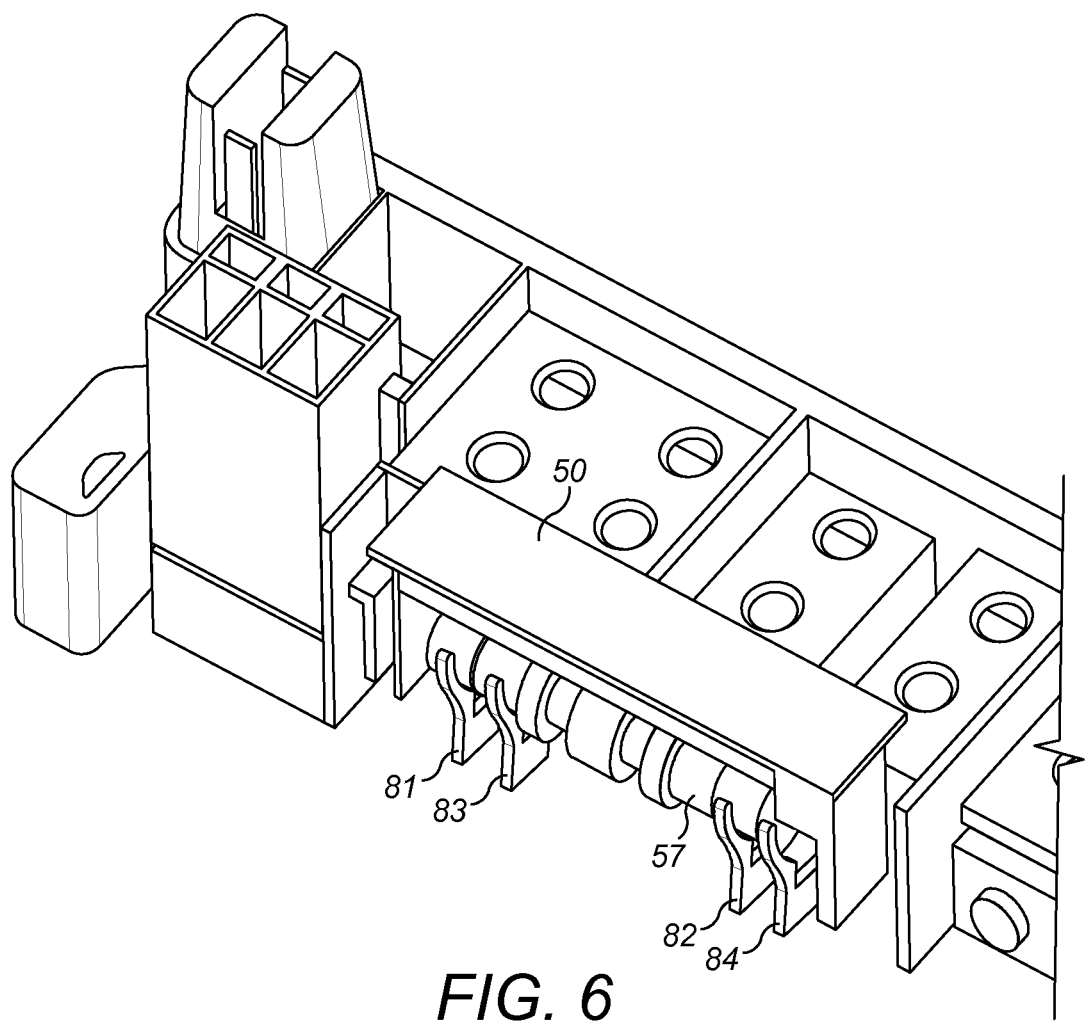
FIG. 6 is a view of the part of the electricity meter of FIG. 5 after a connection selector is installed.

FIG. 6 shows the same terminal area this time with connection selector 50 relative to fuse clips 81-84. In this position, fuse 57 connects fuse clips 81 and 82, thereby closing the second circuit such that the auxiliary device is connected after the meter. Fuse 57 is placed asymmetrically relative to connection selector 50 such that when connection selector 50 is rotated through 180° fuse 57 sits in fuse clips 83 and 84, thereby closing the first circuit such that the auxiliary device is connected before the meter. Thus, by rotating connection selector 50 180° degrees about an axis passing through its midsection, fuse clips 81 and 82 are disconnected and fuse clips 83 and 84 are connected, as seen for example in FIGS. 4c and 4d.

Any feature of the above-described embodiments may be combined with the features of another embodiment, by making the appropriate changes. Whilst the invention has been described in connection with preferred embodiments, it is to be understood that the invention is not limited to these embodiments, and that alterations, modifications, and variations of these embodiments may be carried out by the skilled person without departing from the scope of the invention.

For example, whilst rotation of the connection selector may be preferable in that a space-saving advantage is provided, the device may comprise a fuse support capable of holding a fuse in a fuse position and movable from one position to another without the need for rotation. For example, considering the connection selector shown in the embodiment of FIGS. 4c and 4d, the fuse support may be located equidistant of the first and second ends of the connection selector such that the fuse position may also be fixated equidistant of the first and second ends. The connection selector may then be translated along its longitudinal axis a small amount in order to alternately bring two different pairs of contact points into electrical contact with each other.

In ether embodiments, the device may be arranged to hold multiple fuses, such that in some applications the device could be used to selectively open and close more than two circuits.

The invention claimed is:

1. A device for use with an electricity meter, the device being selectively moveable between first and second positions, and the device comprising: a fuse support capable of holding a fuse in a fuse position, wherein the device is arranged such that, when in the first position, the fuse position is located relative to first and second circuits such that when a fuse is held in the fuse support, the first circuit is closed and the second circuit is open, and wherein the device is further arranged such that moving the device from the first to the second position causes the fuse position to be relocated relative to the first and second circuits such that the first circuit is opened and the second circuit is closed, wherein the first circuit connects the electricity meter and an auxiliary device, and when the first circuit is closed the auxiliary device is connected before the electricity meter such that the electricity meter does not register electricity consumption of the auxiliary device, wherein the second circuit connects the electricity meter and the auxiliary device, and when the second circuit is closed the auxiliary device is connected after the electricity meter such that the electricity meter registers electricity consumption of the auxiliary device.

2. The device of claim 1, further comprising a fuse cover for covering the fuse held in the fuse support when the device is used with the electricity meter.

3. The device of claim 1, further comprising first and second supports, the first support being positioned at a first end of the device and the second support being positioned at a second end of the device, and wherein the fuse position is located between the first and second supports.

4. The device of claim 3, wherein the fuse position is located between the first support and a midsection of the device.

5. The device of claim 4, further comprising a non-conducting element between the midsection and the second support.

6. The device of claim 1, wherein the fuse position is offset from a midsection of the device by a distance less than half a length of the fuse to be held in the fuse support.

7. The device of claim 3, wherein the fuse position is approximately equidistant from the first and second supports.

8. The device of claim 1, further comprising an outwardly extending member for facilitating removal of the device from the electricity meter when the device is in use with the electricity meter.

9. A method of selectively opening and closing first and second circuits connecting an electricity meter and an auxiliary device, comprising:
providing a device with a fuse support capable of holding a fuse in a fuse position;
engaging the fuse with the fuse support such that the fuse is held in the fuse position; and
moving the device from a first position to a second position or moving the device from the second position to the first position, wherein:
when in the first position, the fuse position is located such that the first circuit is closed, the second circuit is open, and the auxiliary device is connected before the electricity meter such that the electricity meter does not register electricity consumption of the auxiliary device; and
when in the second position, the fuse position is located such that the first circuit is open, the second circuit is closed, and the auxiliary device is connected after the electricity meter such that the electricity meter registers electricity consumption of the auxiliary device.

10. The method of claim 9, wherein the moving the device comprises rotating the device 180 degrees about an axis passing through the center of the device.

11. The method of claim 9, wherein in the first position the fuse connects two circuit points of the first circuit and wherein in the second position the fuse connects two circuit points of the second circuit, and wherein in each of the first and second positions each pair of circuit points is located between a respective end of the device and a midsection of the device.

12. The method of claim 9, wherein in the first position the fuse connects two circuit points of the first circuit and wherein in the second position the fuse connects two circuit points of the second circuit, and wherein in each of the first and second positions a first one of each pair of circuit points is located between a first end of the device and a midsection of the device, and wherein the second one of each pair of circuit points is located between a second end of the device and the midsection of the device.

13. A system for selectively opening and closing first and second circuits, comprising:
 a device according to claim 1; and
 a main electrical device connected to the auxiliary device via the first and second circuits.

14. A device for connecting a fuse to a circuit associated with an electricity meter such that electricity consumption for an auxiliary device is measured at the electricity meter when the device is positioned in a first orientation and electricity consumption of the auxiliary device is not measured at the electricity meter when the device is positioned in a second orientation, the device comprising:
 a first leg disposed at a first end of the device;
 a second leg disposed at a second end of the device;
 a crossbar connected to the first leg and the second leg; and
 a fuse support connected to the crossbar and disposed between the first leg and the second leg, the fuse support to removably receive the fuse, the fuse support being arranged to position the fuse closer to the first leg than the second leg when the fuse is received in the fuse support.

15. The device of claim 14, wherein at least one of the first leg, the second leg, the crossbar, or the fuse support is composed of a non-conductive material.

16. The device of claim 14, wherein the first leg, the second leg, and the crossbar form an integral part.

17. The device of claim 14, further comprising:
 a tamper-proof crossbar connected to the crossbar and disposed between the second leg and the fuse support, the tamper-proof crossbar extending from the crossbar in a same direction as the first leg and the second leg.

18. The device of claim 14, further comprising:
 a fuse cover connected to the crossbar and disposed to cover the fuse when received in the fuse support.

19. The device of claim 18, wherein the fuse cover includes a flange for removal of the device from the electricity meter.

20. A system comprising:
 the electricity meter to removably receive the device of claim 14; and
 the device of claim 14.

* * * * *